United States Patent
Sartore et al.

(10) Patent No.: US 7,370,140 B2
(45) Date of Patent: May 6, 2008

(54) ENHANCED DRAM WITH EMBEDDED REGISTERS

(75) Inventors: Ronald H. Sartore, San Diego, CA (US); Kenneth J. Mobley, Colorado Springs, CO (US); Donald G. Carrigan, Monument, CO (US); Oscar Frederick Jones, Jr., Colorado Springs, CO (US)

(73) Assignee: Purple Mountain Server LLC, Los Altos, CA (US)

( * ) Notice: Subject to any disclaimer, the term of this patent is extended or adjusted under 35 U.S.C. 154(b) by 0 days.

(21) Appl. No.: 09/962,287

(22) Filed: Sep. 24, 2001

(65) Prior Publication Data
US 2002/0056020 A1 May 9, 2002

Related U.S. Application Data

(63) Continuation of application No. 09/182,994, filed on Oct. 30, 1998, now Pat. No. 6,347,357, which is a continuation of application No. 08/888,371, filed on Jul. 3, 1997, now Pat. No. 5,887,272, which is a continuation of application No. 08/460,665, filed on Jun. 2, 1995, now Pat. No. 5,721,862, which is a continuation of application No. 08/319,289, filed on Oct. 6, 1994, now Pat. No. 5,699,317, which is a continuation-in-part of application No. 07/824,211, filed on Jan. 22, 1992, now abandoned.

(51) Int. Cl.
*G06F 12/00* (2006.01)

(52) U.S. Cl. .................... 711/105; 711/106; 711/104; 711/111; 711/113; 365/189.04; 365/189.05; 365/230.05

(58) Field of Classification Search ............. 711/105, 711/106, 104, 111, 113; 365/189.04, 189.05, 365/230.08
See application file for complete search history.

(56) References Cited

U.S. PATENT DOCUMENTS 4,577,293 A    3/1986  Matick et al.

(Continued)

FOREIGN PATENT DOCUMENTS

DE    41 18 804 A1    12/1991

(Continued)

OTHER PUBLICATIONS

"DM 2202 EDRAM 1Mb×4 Enhanced Dynamic RAM—Product Review," May 22, 1991, Ramtron, Colorado Springs, Colorado.

(Continued)

*Primary Examiner*—Kimberly McLean
(74) *Attorney, Agent, or Firm*—McDonnell Boehnen Hulbert & Berghoff LLP

(57) ABSTRACT

An enhanced DRAM contains embedded row registers in the form of latches. The row registers are adjacent to the DRAM array, and when the DRAM comprises a group of subarrays, the row registers are located between DRAM subarrays. When used as on-chip cache, these registers hold frequently accessed data. This data corresponds to data stored in the DRAM at a particular address. When an address is supplied to the DRAM, it is compared to the address of the data stored in the cache. If the addresses are the same, then the cache data is read at SRAM speeds. The DRAM is decoupled from this read. The DRAM also remains idle during this cache read unless the system opts to precharge or refresh the DRAM. Refresh or precharge occur concurrently with the cache read. If the addresses are not the same, then the DRAM is accessed and the embedded register is reloaded with the data at that new DRAM address. Asynchronous operation of the DRAM is achieved by decoupling the row registers from the DRAM array, thus allowing the DRAM cells to be precharged or refreshed during a read of the row register.

25 Claims, 5 Drawing Sheets

U.S. PATENT DOCUMENTS

| | | | |
|---|---|---|---|
| 4,608,666 A | | 8/1986 | Uchida |
| 4,725,945 A | | 2/1988 | Kronstadt et al. |
| 4,794,559 A | | 12/1988 | Greeberger |
| 4,870,622 A | | 9/1989 | Aria et al. |
| 4,894,770 A | | 1/1990 | Ward et al. |
| 4,926,385 A | * | 5/1990 | Fujishima ............... 365/230.03 |
| 4,943,944 A | | 7/1990 | Sakui et al. |
| 4,995,001 A | * | 2/1991 | Dawson ..................... 365/154 |
| 5,025,421 A | * | 6/1991 | Cho ..................... 365/230.05 |
| 5,111,386 A | | 5/1992 | Fujishima et al. |
| 5,134,616 A | | 7/1992 | Barth, Jr. et al. |
| 5,148,346 A | | 9/1992 | Naab et al. |
| 5,179,687 A | | 1/1993 | Hidaka et al. |
| 5,184,320 A | | 2/1993 | Dye |
| 5,184,325 A | | 2/1993 | Lipovski |
| 5,214,610 A | | 5/1993 | Houston |
| 5,226,009 A | | 7/1993 | Arimoto |
| 5,226,139 A | | 7/1993 | Fujishima et al. |
| 5,226,147 A | | 7/1993 | Fujishima et al. |
| 5,249,282 A | | 9/1993 | Segers |
| 5,305,280 A | | 4/1994 | Hayano |
| 5,329,489 A | | 7/1994 | Diefendorff |
| 5,353,427 A | | 10/1994 | Fujishima et al. |
| 5,359,722 A | * | 10/1994 | Chan et al. ................. 713/600 |
| 5,381,370 A | | 1/1995 | Lacey et al. |
| 5,390,308 A | | 2/1995 | Ware et al. |
| 5,404,338 A | | 4/1995 | Murai et al. |
| 5,421,000 A | | 5/1995 | Fortino et al. |
| 5,471,601 A | | 11/1995 | Gonzales |
| 5,539,696 A | | 7/1996 | Patel |
| 5,600,605 A | | 2/1997 | Schaefer |
| 5,627,791 A | | 5/1997 | Wright et al. |
| 5,636,173 A | | 6/1997 | Schaefer |
| 5,652,723 A | * | 7/1997 | Dosoka et al. ......... 365/189.01 |
| 5,655,105 A | | 8/1997 | McLaury |
| 5,666,321 A | | 9/1997 | Schaefer |
| 5,673,233 A | | 9/1997 | Wright et al. |

FOREIGN PATENT DOCUMENTS

| | | |
|---|---|---|
| JP | 60-258792 | 12/1985 |
| JP | 63-81692 | 4/1988 |
| JP | 1-159891 | 6/1989 |

OTHER PUBLICATIONS

Sartore, "New Generation of Fast Enhanced DRAMS Replace Static RAM Caches in High-end PC Work Station" 1991.

Niijima et al, "QRAM—Quick Access Memory System", IEEE International Conference, pp. 417-420, Sep. 17, 1990.

Bursky, "Combination DRAM-SRAM Removes Secondary Caches", Electr. Design, vol. 40, No. 2, pp. 39-43, Jan. 23, 1992.

Goodman et al. "Use of Static Column RAM as a Memory Hierarchy," 11th Annual Symposium, IEEE, 1984, pp. 167-174.

Ohta et al., "A 1 MB DRAM with 33 MHz Serial I/O Ports" *Digest of Technical Papers*, 1986 IEEE, pp. 274-275 (1986).

Hitachi, "Multiport Video RAM," Specification for parts HM53461 and HM 53462, pp. 30-33.

Dosaka et al., "A 100MHz 4Mb Cache DRAM with Fast Copy-back Scheme," *Digest of Technical Papers*, 1992 IEEE International Solid-State Circuits Conference, p. 148-49 (Jun. 1992).

* cited by examiner

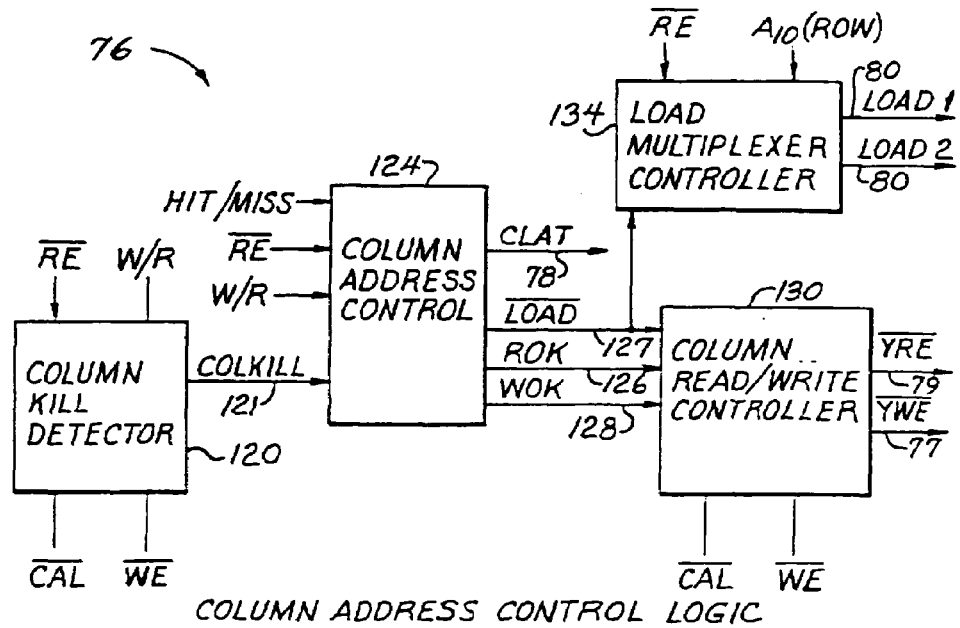
FIG. 5 COLUMN ADDRESS CONTROL LOGIC
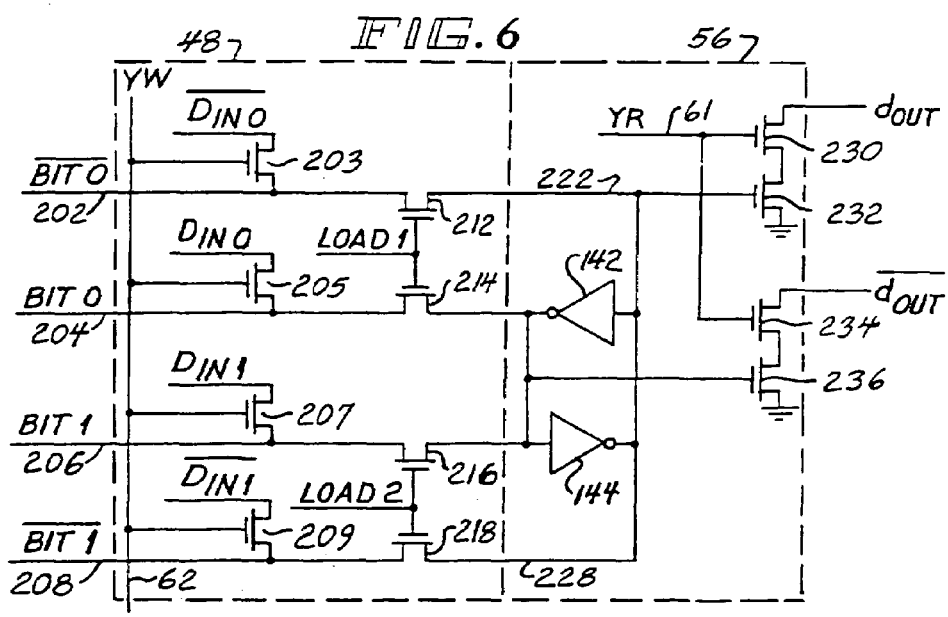
FIG. 6

ENHANCED DRAM WITH EMBEDDED REGISTERS

The present application is a continuation of U.S. patent application Ser. No. 09/182,994, filed Oct. 30, 1998, now U.S. Pat. No. 6,347,357 which is a continuation of U.S. patent application Ser. No. 08/888,371, filed Jul. 3, 1997 (now U.S. Pat. No. 5,887,272), which is a continuation of U.S. patent application Ser. No. 08/460,665, filed Jun. 2, 1995 (now U.S. Pat. No. 5,721,862), which is a continuation of U.S. patent application Ser. No. 08/319,289 filed Oct. 6, 1994 (now U.S. Pat. No. 5,699,317), which is a continuation-in-part of U.S. patent application Ser. No. 07/824,211 filed Jan. 22, 1992 (abandoned), all of which applications are incorporated herein by reference.

FIELD OF THE INVENTION

The present invention relates to dynamic random access memory ("DRAM") and more particularly to an Enhanced DRAM (which we call an "EDRAM") with embedded registers to allow fast random access to the DRAM while decoupling the DRAM from data processing operations.

BACKGROUND OF THE INVENTION

As the computer industry evolves, demands for memory have out-paced the technology of available memory devices. One of these demands is high speed memory compatibility. Thus, in a computer system, such as a personal computer or other computing system, memory subsystems have become an influential component toward the overall performance of the system. Emphasis is now on refining and improving memory devices that provide affordable, zero-wait-state operations.

Generally, volatile memories are either DRAM or static RAM ("SRAM"). Each SRAM cell includes plural transistors. Typically the data stored in a SRAM cell is stored by the state of a flip-flop formed by some of the transistors. As long as power is supplied, the flip-flop keeps its data: it does not need refreshing. In a DRAM cell, on the other hand, there typically is one transistor, and data is stored in the form of charge on a capacitor that the transistor accesses. The capacitor dissipates its charge and needs to be refreshed.

These two types of volatile memories have respective advantages and disadvantages. With respect to memory speed, the SRAM is faster than the DRAM due, partially at least, to the nature of the cells. The disadvantage, however, is that because there are more transistors, the SRAM memory is less dense than a DRAM of the same physical size. For instance, static RAMs traditionally have a maximum of one-fourth the number of cells of a DRAM which uses the same technology.

While the DRAM has the advantage of smaller cells and thus higher cell density (and lower cost per bit), one disadvantage is that the DRAM must refresh its memory cells whereas the SRAM does not. While the DRAM refreshes and precharges, access to the memory cells is prohibited. This creates an increase in access time, which drawback the static RAM does not suffer.

However, the speed and functionality of current DRAMS are often emphasized less than memory size (storage capacity) and cost. This is evidenced by the fact that DRAM storage capacity density has increased at a rate an order of magnitude greater than its speed. While there has been some improvement in access time, systems using DRAMs generally have had to achieve their speed elsewhere.

In order to increase system speed, cache memory techniques have recently been applied to DRAM main memory. These approaches have generally been implemented on a circuit board level. That is, a cache memory is frequently a high-speed buffer interposed on the circuit board between the processor chip and the main memory chip. While some efforts have been made by others to integrate a cache with DRAM, we first address the board level approach.

FIG. 1 indicates a prior art configuration (board-level) wherein a processor chip 10 is configured with a cache controller 12 and a cache memory 14. The main purpose of the cache memory is to maintain frequently accessed data for high speed system access. Cache memory 14 (sometimes called "secondary cache static RAM") is loaded via a multiplexer 16 from DRAMs 20, 22, 24 and 26. Subsequently, data is accessed at high speeds if stored in cache memory 14. If not, DRAMs 20, 22, 24 and/or 26 load the sought data into cache memory 14. As seen in FIG. 1, cache memory 14 may comprise a SRAM, which is generally faster than DRAMS 20-26.

Various approaches have been proposed for cache memory implementation. These approaches include controlling external cache memory by a controller, such as cache memory 14 and cache controller 12 in FIG. 1, or discrete proprietary logic. Notwithstanding its benefits, cache memory techniques complicate another major problem that exists in system design. Memory components and microprocessors are typically manufactured by different companies. This requires the system designer to effectively bridge these elements, using such devices as the cache controller 12 and the multiplexer 16 of FIG. 1. These bridge components are usually produced by other companies. The different pin configurations and timing requirements of these components makes interfacing them with other devices difficult. Adding a cache memory that is manufactured by yet another company creates further design problems, especially since there is no standard for cache implementation.

Exacerbating the system design problems is the disadvantage that the use of external cache memory (such as cache memory 14) compromises the main storage access speed. There are mainly two reasons for this compromise. First, and most significant, the main storage access is withheld until a "cache miss" is realized. The penalty associated with this miss can represent up to two wait states for a 50 MHz system. This is in addition to the time required for a main memory access. Second, the prioritized treatment of physical routing and buffers afforded the external cache is usually at the expense of the main memory data and address access path. As illustrated in FIG. 1, data from DRAMs 20, 22, 24 and 26 can be accessed only through cache memory 14. The actual delay may be small, but adds up quickly.

A third problem associated with separate cache and main memory is that the time for loading the cache memory from the main memory ("cache fill") is dependent on the number of inputs to the cache memory from the main memory. Since the number of inputs to the cache memory from the main memory is usually substantially less than the number of bits that the cache memory contains, the cache fill requires many clock cycles. This compromises the speed of the system.

A memory architecture that has been used or suggested for video RAMs ("VRAMs") is to integrate serial registers with a main memory. VRAMs are specific to video graphics applications. A VRAM may comprise a DRAM with high speed serial registers allowing an additional access port for a line of digital video data. The extra memory used here is known as a SAM (serially addressed memory), which is loaded using transfer cycles. The SAM's data is output by using a serial clock. Hence, access to the registers is serial, not random. Also, there is continuous access to the DRAM so refresh is not an issue as it is in other DRAM applications.

Another implementation that is expected to come to market in 1992 of on-chip cache memory will use a separate cache and cache controller sub-system on the chip. It uses full cache controllers and cache memory implemented in the same way as it would be if external to the chip, i.e. a system approach. This approach is rather complicated and requires a substantial increase in die size. Further, the loading time of the cache memory from the main memory is constrained by the use of input/output cache access ports that are substantially fewer in number than the number of cache memory cells. A cache fill in such a manner takes many clock cycles, whereby system access speed suffers. Such an approach is, in the inventors' views, somewhat cumbersome and less efficient than the present invention.

Still another problem in system design arises when the system has both (a) interleaved memory devices together with (b) external cache memory. Interleaving assigns successive memory locations to physically different memory devices, thereby increasing data access speed. Such interleaving is done for high-speed system access such as burst modes. The added circuitry for cache control and main memory multiplexing usually required by external cache memory creates design problems for effective interleaved memory devices.

Another problem with the prior art arises when memory capacity is to increase. Adding more memory would involve adding more external SRAM cache memory and more cache control logic. For example, doubling the memory size in FIG. 1 requires not only more DRAM devices required, but also another multiplexer and possibly another cache controller. This would obviously add to system power consumption, detract from system reliability, decrease system density, add manufacturing costs and complicate system design.

Another problem concerns the cost of manufacturing a system with an acceptable cache hit probability. When using external cache memory, manufacturers allocate a certain amount of board area for the main memory. A smaller area is allocated for the external cache. Usually, it is difficult to increase the main memory and the external cache memory while maintaining an acceptable cache hit probability. This limitation arises from the dedication of more board area for the main memory than for external cache.

A further problem with system speed is the need for circuitry external to the main memory to write "post" data. Post data refers to data latched in a device until it is needed. This is done because the timing requirement of the component needing the data does not synchronize with the component or system latching the data. This circuitry usually causes timing delays for the component or system latching the data.

As stated supra, access to the DRAM memory cells during a precharge and refresh cycle was prohibited in the prior art. Some prior art approaches have tried to hide the refresh in order to allow access to DRAM data. One DRAM arrangement maintained the data output during a refresh cycle. The drawback of this arrangement was that only the last read data was available during the refresh. No new data read cycle could be executed during the refresh cycle.

A pseudo-static RAM is another arrangement that attempted to hide the refresh cycle. The device was capable of executing internal refresh cycles. However, any attempted data access during the refresh cycle would extend the data access time, in a worst case scenario, by a cycle time (refresh cycle time plus read access time). This arrangement did not allow true simultaneous access and refresh, but used a time division multiplexing scheme to hide the refresh cycle.

Another way to hide the refresh cycle is to interleave the RAM memory on the chip. When a RAM memory block with even addresses is accessed, the odd memory block is refreshed and vice-versa. This type of implementation requires more timing control restraints which translate to a penalty in access time.

Another type of problem arises when considering the type of access modes to the main memory. One type of access is called page mode, in which several column addresses are synchronously applied to an array after a row address has been received by the memory. The output data access time will be measured from the timing clock edge (where the column address is valid) to the appearance of the data at the output.

Another type of access mode is called static column mode wherein the column addresses are input asynchronously. Access can occur in these modes only when RAS is active (low), and a prolonged time may be required in the prior art.

When manufacturing chips that support these access types, only one of these access types can be implemented into the device. Usually, one of the last steps in the making of the memory chip will determine if it will support either type of access. Thus, memory chips made this way do not offer both access modes. This induces an added expense in that the manufacturer must use two different processes to manufacture the two types of chips.

To overcome these problems, small modifications added to a component, such as a DRAM, may yield an increase in system performance and eliminate the need for any bridging components. To successfully integrate the modification with the component, however, its benefit must be relatively great or require a small amount of die space. For example, DRAM yields must be kept above 50% to be considered producible. Yields can be directly correlated to die size. Therefore, any modifications to a DRAM must take into account any die size changes.

In overcoming these problems, new DRAM designs have become significant. The greatest disadvantage to caching within DRAMs has been that DRAMs are too slow. The present invention in one of its aspects seeks to change the architecture of the DRAM to take full advantage of high caching speed that may now be obtainable.

One way to meet this challenge is to integrate the functions of the main storage and cache. Embedding the cache memory within localized groups of DRAM cells would take advantage of the chip's layout. This placement reduces the amount of wire (conductive leads) used in the chip which in turn shortens data access times and reduces die size.

U.S. Pat. No. 5,025,421 to Cho is entitled "Single Port Dual RAM." It discloses a cache with typical DRAM bit lines connected to typical SRAM bit lines through pass gates. Reading and writing the SRAM and DRAM arrays occurs via a single port, which requires that input/output busses communicate with the DRAM bit lines by transmitting data through the SRAM bit lines. Using SRAM bit lines to access the DRAM array precludes any access other than refresh to the DRAM array while the SRAM array is being accessed, and conversely precludes access to the SRAM array while the DRAM array is being accessed, unless the data in the SRAM is the same data as in the currently accessed DRAM row. This is a functional constraint that is disadvantageous.

Moreover, the SRAM cells of Cho FIG. 1 are full SRAM cells, although his FIG. 4 may disclose using only a single latch (FF11) rather than an entire SRAM cell. However, the use of a single port with a simple latch raises a severe problem. Such an architecture lacks the ability to write data into the DRAM without corrupting the data in the SRAM latch. Hence, the FIG. 4 configuration is clearly inferior to Cho's FIG. 1 configuration.

Another effort is revealed by U.S. Pat. No. 4,926,385 to Fujishima, Hidaka, et al., assigned to Mitsubishi, entitled, "Semiconductor Memory Device With Cache Memory Addressable By Block Within Each Column." There are other patents along these lines by Fujishima and/or Hidaka. This one uses a row register like Cho FIG. 4. Two ports are used, but two decoders are called for. While this overcomes several of the problems of Cho, it requires a good deal more space consumed by the second column decoder and a second set of input/output switch circuitry. (Subsequent Fujishima/ Hidaka patents have eliminated the second access port and second decoder and have reverted to the Cho FIG. 1 approach, despite its disadvantages.) Nevertheless, in this patent, the "tag" and data coherency control circuitry for the cache is external to the chip and is to be implemented by the customer as part of the system design. The "tag" refers to information about what is in the cache at any given moment. A "hit" or "miss" indication is required to be generated in the system, external to the integrated circuit memory, and supplied to the chip. This leads to a complicated and slower system.

Other Fujishima, Hidaka, et al. U.S. patents include U.S. Pat. Nos. 5,111,386; 5,179,687; and 5,226,139.

Arimoto U.S. Pat. No. 5,226,009 is entitled, "Semiconductor memory device supporting cache and method of driving the same." This detects whether a hit or miss occurs by using a CAM cell array. The basic arrangement is like the approach of Cho FIG. 1 but modified to collect DRAM data from an "interface driver," which is a secondary DRAM sense amplifier, rather than from the primary DRAM sense amplifiers. This architecture still accesses the DRAM bit lines via the SRAM bit lines and is plagued with the single port problem. Circuitry is provided to preserve coherency between the DRAM and the SRAM. A set of tag registers is discussed with respect to a system-level (off-chip) implementation in a prior art drawing. Arimoto implements his on-chip cache tag circuitry using a content addressable memory array. That approach allows N-way mapping, which means that a group of memory devices in the cache can be assigned to any row in any of N subarrays. For example, if an architecture is "4-way associative," this means that there are four SRAM blocks, any of which can be written to by a DRAM. This method results in a large, expensive, and slow implementation of mapping circuitry. Using a CAM array for tag control has an advantage of allowing N-way association. However, the advantage of N-way association seems not to outweigh the disadvantage of the large and slow CAM array to support the N-way SRAM array.

Dye U.S. Pat. No. 5,184,320 is for a "Cached random access memory device and system" and includes on-chip cache control. The details of the actual circuitry are not disclosed, however. This patent also is directed to N-way association and considerable complication is added to support this.

Another piece of background art is Matick et al. U.S. Pat. No. 4,577,293 for a "Distributed on-chip cache." It has 2-way associative cache implemented using a distributed (on-pitch) set of master-slave row register pairs. Full flexibility of access is provided by dual ports that are not only to the array but also to the chip itself. The two ports are totally independent, each having pins for full address input as well as data input/output. The cache control is on-chip.

Thus it should be appreciated that the art has heretofore often directed efforts in achieving N-way association. While this has led to complications, the art has thought that N-way association is the approach to follow.

The present invention, according to one of its aspects, rejects this current thinking and instead provides a streamlined architecture that not only includes on-chip cache control, but also operates so fast that the loss of N-way association is not a concern.

Therefore, it is a general object of this invention to overcome the above-listed problems.

Another object of the present invention is to isolate the cache memory data access operation from undesirable DRAM timing overhead operations, such as refresh and precharge.

A further object of the present invention is to eliminate the need for a external static RAM cache memory in high speed systems.

Still another object of the present invention is to insure cache/main memory data coherency.

Another object of this invention is to insure such data coherency in a fashion which minimizes overhead, so as to reduce any negative impact such circuitry might have on the random data access rate.

SUMMARY OF THE PRESENT INVENTION

The present invention provides a high-speed memory device that is hybrid in its construction and is well-suited for use in high-speed processor-based systems. A preferred embodiment of the present invention embeds a set of tightly coupled row registers, usable for a static RAM function, in a high density DRAM, preferably on the very same chip as the DRAM array (or subarrays). Preferably, the row registers are located within or alongside the DRAM array, and if the DRAM is configured with subarrays, then multiple sets of row registers are provided for the multiple subarrays, preferably one set of row registers for each subarray. Preferably the row registers are oriented parallel to DRAM rows (word lines), orthogonal to DRAM columns (bit lines). The row registers operate at high speed relative to the DRAM. Preferably the number of registers is smaller than the number of bit lines in the corresponding array or subarray. In the preferred embodiment, one row register corresponds to two DRAM bit line pairs, but in other applications, one register could be made to correspond to another number of DRAM bit line pairs. Preferably selection circuitry is included to select which of the several bit line pairs will be coupled (or decoupled) from the corresponding row register.

Preferably the row registers are directly mapped, i.e. a one-way associative approach is preferred. Preferably the configuration permits extremely fast loading of the row registers by connecting DRAM bit lines to the registers via pass gates which selectively couple and decouple bit lines (bit line pairs) to the corresponding row registers. Thus, by selecting which bit line pairs are to be given access to the row registers, the sense amplifiers for example drive the bit lines to the voltages corresponding to the data states stored in a decoded row of DRAM cells and this is loaded quickly into the row registers. Thus, a feature of the present invention is a very quick cache fill.

The fast fill from the DRAM to the row registers provides a very substantial advantage. In the case of a read miss, mentioned below, a parallel load to the row registers is executed. Thereafter, each read from the same row is a read hit, which is executed at SRAM speeds rather than DRAM speeds.

Preferably the row registers are connected to a unidirectional output (read) port, and preferably this is a high impedance arrangement. That is, in the preferred embodiment, the registers are not connected to the source-drain path of the read port transistors, but instead they are connected to gate electrodes thereof. This leads to improvements in size and power.

The DRAM bit lines are preferably connected to a unidirectional input (write) port. In a circuit according to some aspects of the invention, the row registers can be decoupled from the DRAM bit lines and data could still be inputted to the DRAM bit lines via the write port. Moreover, even when the row registers are decoupled from the DRAM bit lines, data can be read from the row registers.

Preferably both the read and write ports operate off one decoder.

The configuration of an integrated circuit memory according to a related aspect of the invention will not require an input/output data buss connected to the sense amplifiers, since each DRAM subarray will be located between its corresponding set of row registers and the DRAM subarray's corresponding set of sense amplifiers, and since the data input and output functions are executed on the row register side.

In addition to including row registers, preferably in a directly mapped configuration, a circuit using the present invention preferably integrates simple, fast control circuitry for the cache (registers). Hence the integrated circuit memory device preferably contains on-chip address compare circuitry, including at least one "last read row" address latch and an address comparator. Where multiple subarrays are used, multiple sets of row registers are used, each having a respective "last read row" and thus a respective "last read row" register. Address and data latches, a refresh counter, and various logic for controlling the integrated circuit memory device also are preferably included on the chip.

Memory reads preferably always occur from the row registers. When an address is received by the memory device, the address comparator determines whether that address corresponds to an address of the row that was last read into the associated row register. When the address comparator detects a match ("hit"), only the row register is accessed, and the data stored there is available from the addressed column at SRAM speeds. Subsequent reads within the row (burst reads, local instructions or data) will continue at that same high speed.

When a read "miss" is detected, the DRAM main memory is addressed and the addressed data is written into the row register. In the event of such a "miss," the first bit of data is available at the output at a slightly slower speed than a hit. Subsequent bits read from the row register will have the same extremely fast access as for a hit.

Since the data corresponding to the received address is read from the row register in both cases, and since according to another aspect of the invention in its preferred form the row register can be decoupled from the DRAM, the DRAM precharge can occur simultaneously and asynchronously without degrading overall system performance. The refresh counter and an independent refresh bus are implemented to allow the main memory (i.e., the arrayed DRAM cells) to be refreshed during row register reads.

Memory writes are preferably directed toward the main memory. When appropriate, i.e., in a "write hit," the on-chip address comparator will also activate circuit elements to achieve a simultaneous write to the row registers. In this way, the data in the row register and the data in the main memory will be coherent for the same address. In a "write miss," where data is to be written into DRAM addresses that are not the same as the "last read row" for that particular DRAM block or subarray, the row register contents need not, and preferably will not, be overwritten. Moreover, changing rows during memory writes does not affect the contents of the row register until the row address specified writing becomes the same as the "last read row." This allows the system (during write misses) to return immediately to the row register which had been accessed just prior to the write operation. Write posting can be executed without external data latches. Page mode memory writes can be accomplished within a single column address cycle time.

Without initiating a major read or write cycle, the row registers can be read under column address control. It is preferred that the chip is activated and the output is enabled.

The toggling of the on-chip address latch by the user allows the preferred embodiment of the present invention to operate in either a page or static column mode. Further, the zero nano-second hold allows the /RE signal to be used to multiplex the row and column addresses.

When a read hit occurs on an /RE initiated cycle, the internal row enable signal is not enabled and a DRAM access does not occur, thereby shortening the cycle time and the precharge required.

A novel and important aspect of the operation of such a DRAM with embedded row registers is the provision of zero-wait state random data accesses from the cache memory while the DRAM is being refreshed or precharged, or otherwise operated asynchronously.

Another salutary aspect of the invention is that within the array structure is embedded cache memory that allows quicker cache memory fill and optimization of die density.

Another aspect of the invention is the way in which pins are used. Functions heretofore included in /RAS and /CAS have been reassigned to separate pins for refresh control, output enable control, and chip selection. The control signals /CAS and /RAS are replaced by a column address latch signal /CAL and a row enable signal /RE, each having a respective dedicated pin. This change in pin usage permits faster operation.

The invention also includes methods for operating a DRAM with embedded registers. A first method of operating the memory device may comprise the steps of: (1) initiating a major read or write cycle; (2) comparing the row address with the previous row address to determine whether the sought data is in the cache memory; (3) if in a read cycle, reading the data from the cache memory if it is stored there or loading the data into the cache memory from the main memory and then reading the data from the cache memory; and (4) if in a write cycle, writing only to the main memory if the data is not in the cache memory or writing to both main memory and cache memory if the data is in the cache memory.

A second method for operating the memory device may comprise the steps of: (1) refreshing a row of main memory; and (2) simultaneously and asynchronously reading the cache memory.

BRIEF DESCRIPTION OF THE DRAWINGS

The invention, together with its objects and the advantages thereof, may best be understood by reference to the following detailed description taken in conjunction with the accompanying drawings, of which:

FIG. 5 is a detailed block diagram of a column address control circuit contained in FIG. 3;

FIG. 6 is a detailed diagram of the write load multiplexer and the row register of FIG. 3.

DETAILED DESCRIPTION OF THE PREFERRED EMBODIMENT

Figure 1:
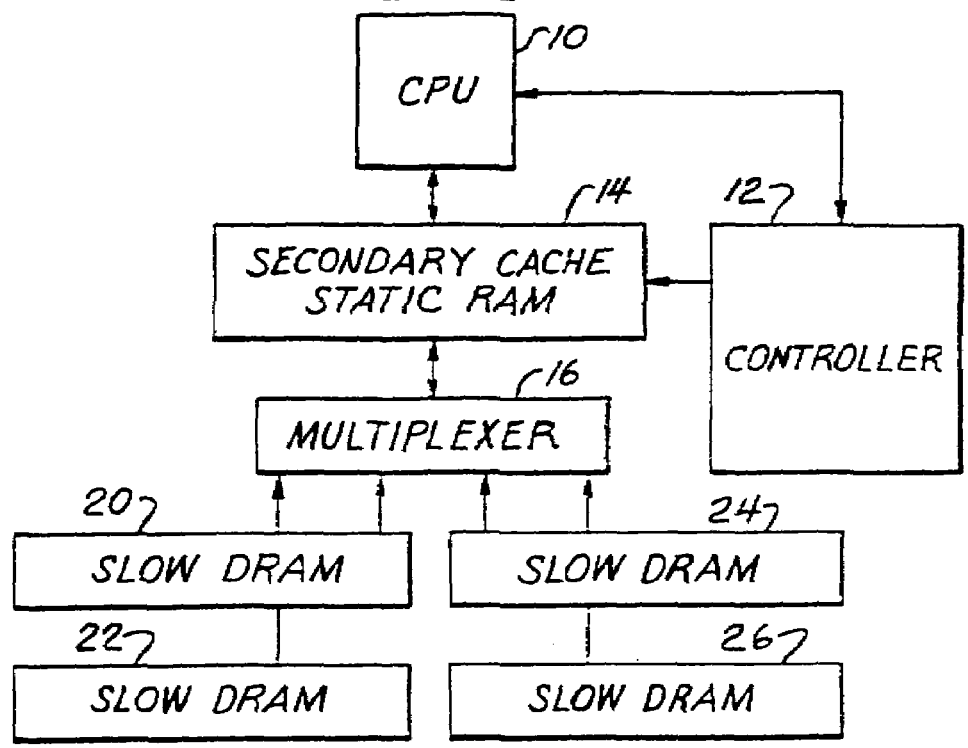
FIG. 1 is a block diagram of the prior art cache implementation showing several different chips and circuits.
Figure 2:
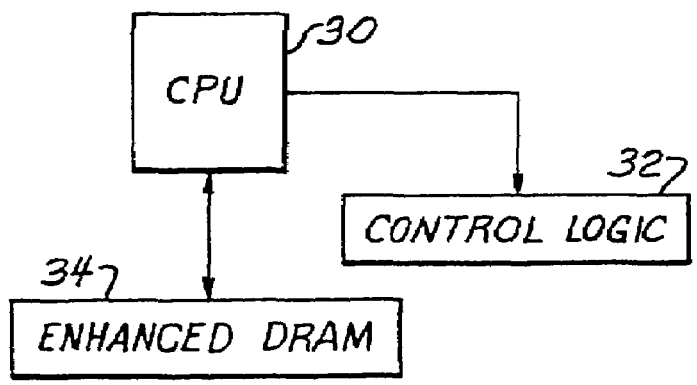
FIG. 2 is a block diagram showing how a processor may be connected to an enhanced DRAM according to the present invention.

The FIG. 2 block diagram shows a CPU (processing unit) 30 preferably connected to both control logic circuitry 32 and an EDRAM 34. Each such circuit 30, 32, 34 is on a respective integrated circuit ("chip"). As can be seen in comparison with FIG. 1, the preferred embodiment of FIG. 2 uses only three chips as compared to the eight chips of FIG. 1. This FIG. 2 arrangement provides greater system performance, lower system cost, lower system power requirements, increased system reliability, improved system density, simplified system design and easy memory system salability.

Together with external control logic contained in control logic 32, EDRAM 34 of FIG. 2 supplants secondary cache 14, cache controller 12, multiplexer 16 and slow DRAMs 20, 22, 24 and 26 of FIG. 1. The total memory capacity of the four slow DRAM chips 20, 22, 24 and 26 can be combined onto one chip without the need for interleaving, thus obviating multiplexer 16. Further, EDRAM 34 preferably contains internal cache and cache control logic, thereby obviating secondary cache 14 and portions of cache controller 12. It will be appreciated therefore that the present invention also reduces board space.

With such integration of the various chip functions of the prior art, access to data in cache memory will have a zero wait-state. This fast access time will allow data transfer at high speeds (such as done in burst modes) without the need for interleaving or costly external cache memory. In addition, access to the EDRAM is preferably address sequence independent. This makes interleaving easier when used with address sequence dependent modes.

A more detailed description of EDRAM 34 will be discussed with reference to FIG. 3, which is a functional block diagram. EDRAM 34 preferably receives the following input signals on respective pins:

| | |
|---|---|
| chip select signal | /S |
| refresh control signal | /F |
| write/read signal | W/R |
| row enable signal | /RE |
| output enable signal | /G |
| write enable signal | /WE |
| address data | $A_0$-$A_{10}$ |
| column address latch signal | /CAL. |

Output data is illustratively four bits wide. These output bits may use four pins that can be called DQ0, DQ1, DQ2, and DQ3. The DQ pins may be used to receive input data signals DIN and to provide output data DOUT.

A 4 Mb memory according to the present invention can be arranged in a 28-pin package, using the following as illustrative pin assignments:

| signal | pin | | signal |
|---|---|---|---|
| A0 | 1 | 28 | Vss |
| A1 | 2 | 27 | DQ0 |
| A3 | 3 | 26 | DQ1 |
| A4 | 4 | 25 | DQ2 |
| A5 | 5 | 24 | DQ3 |
| /RE | 6 | 23 | /G |
| Vcc | 7 | 22 | Vcc |
| Vss | 8 | 21 | Vss |
| A6 | 9 | 20 | /WE |
| A7 | 10 | 19 | /S |
| A8 | 11 | 18 | /F |
| A2 | 12 | 17 | W/R |
| A9 | 13 | 16 | /CAL |
| Vcc | 14 | 15 | A10 |

Figure 3:
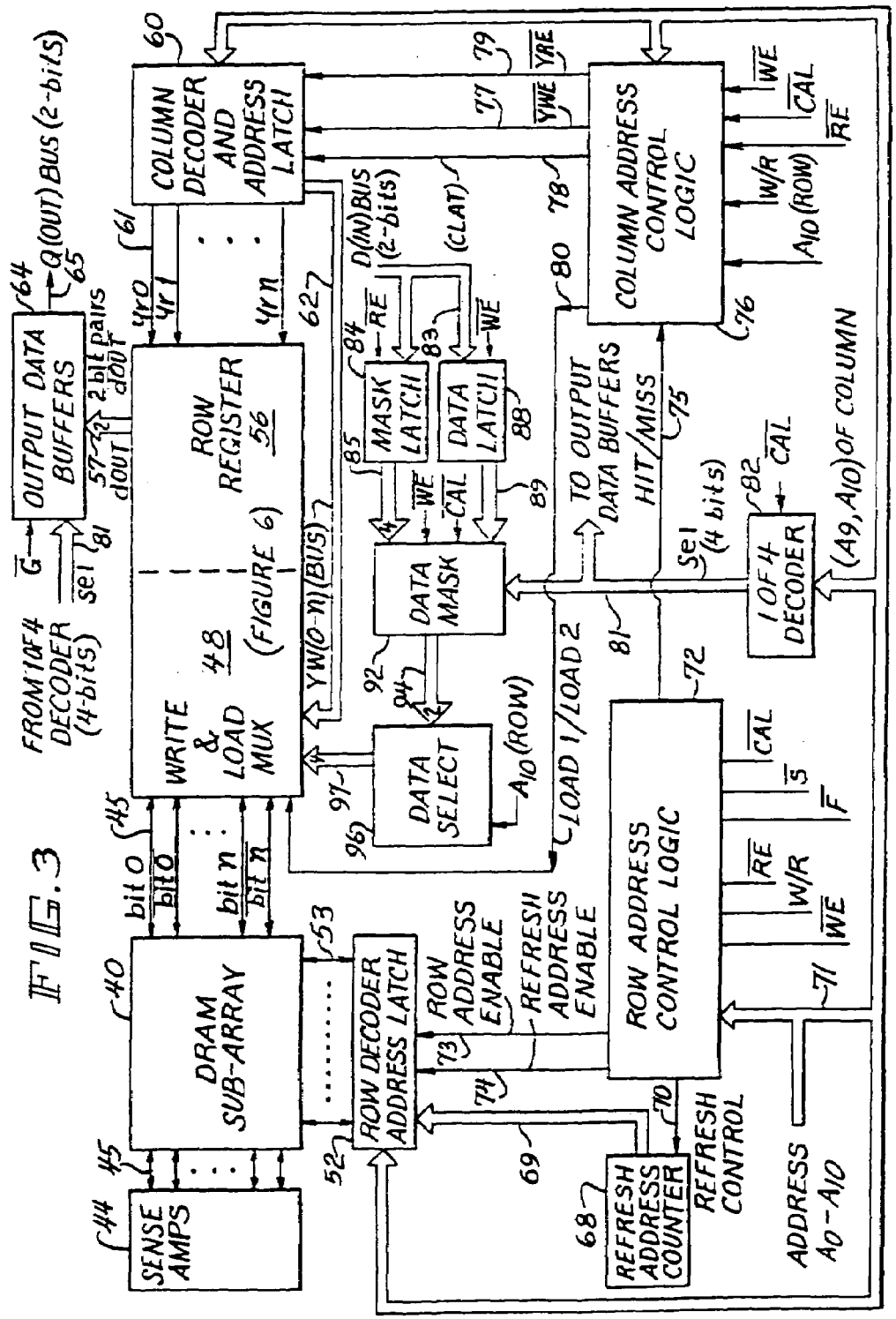
FIG. 3 is a functional block diagram of the enhanced DRAM shown in FIG. 2.

By way of major components, the circuit of FIG. 3 comprises a DRAM subarray 40. Associated therewith are sense amplifiers 44 coupled to the bit lines 45 in the subarray. At the right side of subarray 40, bit lines 45 (or other conductors) couple data bits to a circuit block, the left portion of which is a write and load multiplexer 48. The right portion of this block is a row register 56. FIG. 6 shows this block in schematic form.

FIG. 3 also shows a row decoder/address latch 52 which is coupled via a plurality of leads 53 to DRAM subarray 40.

The row register 56 part of FIG. 3 receives signals from write and load multiplexer 48 via transistors shown in FIG. 6. Row register 56 is further coupled to receive signals from a column decoder 60 via a plurality of leads 61. Row register 56 outputs signals on leads 57 to output data buffers 64, which drive an output bus 65 of the circuit.

A refresh address counter 68 provides a plurality of signals on a bus 69 to row decoder and address latch 52. Counter 68 receives a refresh control signal via a lead 70 from row address control logic circuitry 72. As will be appreciated, having an on-chip refresh counter 68 and independent refresh bus 69 will allow the DRAM cells to be refreshed during cache reads.

An address bus 71 is coupled to several blocks within FIG. 3, including row decoder 52, row address control logic 72, column decoder 60, and further circuits discussed infra. Address bus 71 illustratively receives eleven bits of address data $A_0$-$A_{10}$. This address data preferably includes 11 bits of row data and then 11 further bits of column data, or vice-versa. Alternatively but not preferably, the bus could carry a smaller number of bits of both row and column addresses simultaneously. Another alternative, but not preferred, configuration would provide two separate address buses: one for row addresses only and the other for column addresses only.

Address data on bus 71 is also applied to column address control logic circuitry 76. Also, a one-of-four decoder 82 preferably receives address data bits $A_9$ and $A_{10}$ from bus 71 and the column address latch signal /CAL (mentioned above as one of the input signals). As noted, address bus 71 is preferably multiplexed so that it carries row addresses and column addresses at respective times. Column address latch signal /CAL, chip select signal /S, refresh control signal /F, row enable signal /RE, write/read signal W/R, and write enable signal /WE are connected to row address control logic 72.

Figure 7:
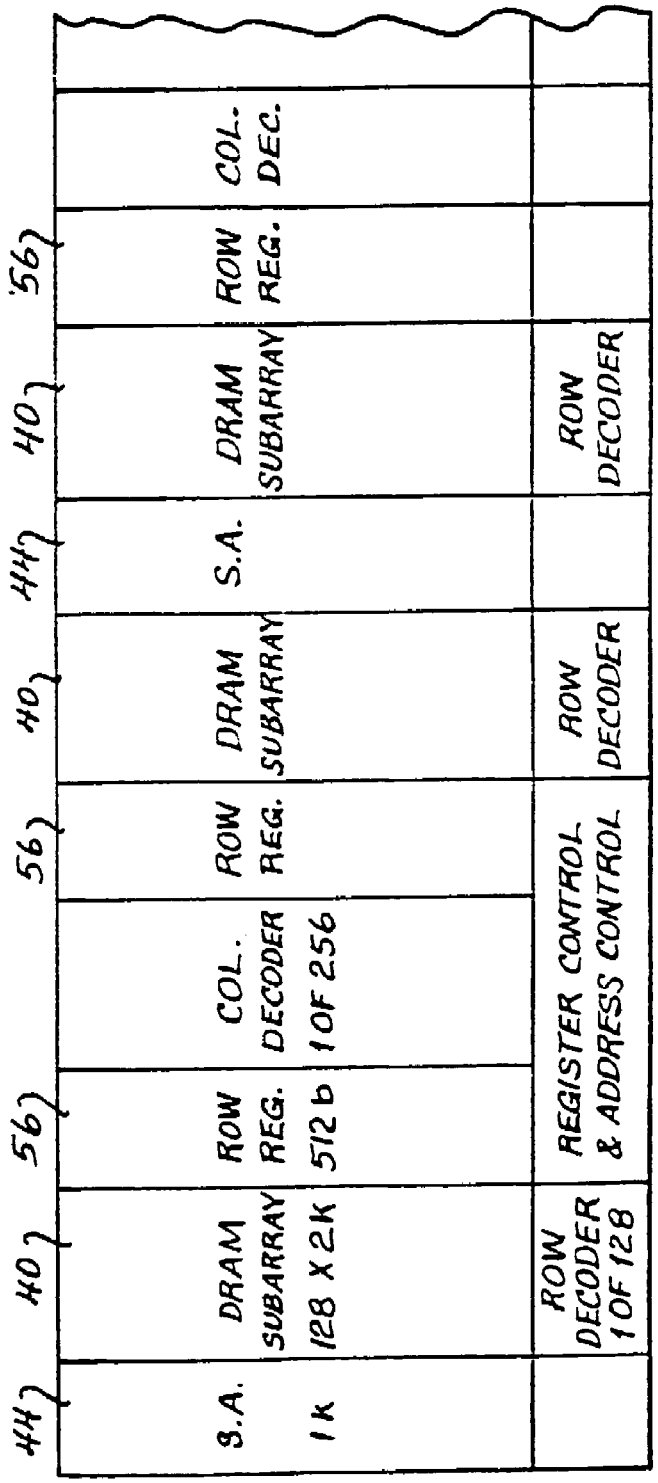
FIG. 7 shows an orientation within a DRAM chip of multiple subarrays and some associated circuitry from FIG. 3.

Row address control logic 72 provides a row address enable signal and a refresh address enable signal on lines 73 and 74, respectively, to row decoder circuit 52. Row decoder 52 is coupled to memory array 40, such as to its word lines, as is well-known. The word lines 53 are preferably orthogonal to columns (bit lines 45) in memory array 40, which may or may not contain subarrays. Preferably a group of sense amplifiers 44 are to one side of their corresponding array 40 and the corresponding row register 56 is on the opposite side of the array or subarray. This positioning of the subarray between its corresponding sense amplifiers and corresponding row registers is seen in FIG. 7 also.

Preferably row register 56 is embedded at the ends of the bit lines 45 of subarray 40. This arrangement minimally increases the die size of the preferred embodiment. Further, as illustrated in FIG. 6, two bit line pairs (bit0 and /bit0, and bit1 and /bit1) are coupled to cross-coupled inverters 142 and 144 of row register 56. It will be appreciated that such cross-coupled inverters comprise a static flip-flop usable as a static memory cell. This circuit facilitates the extremely fast row register 56 fill since each of the inverter pairs, illustratively inverters 142 and 144, are selectively coupled to preferably two bit line pairs as will be discussed below. It will be understood that the row register 56 includes a plurality of inverter pairs.

Preferably embedding the row register 56 and sense amplifiers 44 on respective opposing ends of the DRAM array (or subarray) takes advantage of the impedance of the bit line pairs. This impedance helps maintain the state of sense amplifiers 44 when an unaltered (masked) write operation is performed. A masked write operation is where a memory bit or bits are written with a common mode high level voltage. This voltage on the bit line(s) will not cause the sense amplifiers 44 to toggle. Therefore, when the common mode high level voltage is removed from the intended unaltered bit line(s), the sense amplifier will restore the bit line(s) to the prior state.

It may be noted here that no input/output bus lines are shown to sense amplifiers 44. It will be appreciated from discussions infra that data is written into the DRAM subarray via a dedicated input (write) port illustrated in FIG. 6. A separate output (read) port is shown also in FIG. 6, using a high impedance circuit arrangement.

It will be understood that the symbol "Y" connotes a column or column signal, of which there are several types (write, write enable, read, read enable). Multiplexer 48 is preferably coupled to receive (decoded) write enable signals Yw from column decoder 60. Row register 56 preferably receives as inputs a plurality of (decoded) column read signals Yr transmitted on n+1 lines 61 from column decoder 60 via a bus 62. Row register 56 outputs data signals $D_{out}$ via bus 57 to output data buffer 64. Buffer 64 also preferably receives the output enable signal /G and a select bus 81 as inputs. Buffers 64 preferably output the output data Q on bus 65. Bus 65 is preferably 4-bits wide.

Column address control logic circuit 76 preferably further receives as an input a hit/miss signal transmitted on a line 75 from row address control logic 72. Control logic 76, as illustrated, outputs a load1/load2 signal to multiplexer 48 via bus 80. Control logic 76 also preferably outputs a column read enable /Yre, column write enable /Ywe and column address (decode) enable to decoder 60 by way of lines 79, 77 and 78, respectively. Inputs to column address control 76 also preferably include write enable signal /WE, column address latch signal /CAL, read enable signal /RE, write/read signal W/R and address bit $A_{10}$ preferably of row address data.

Input data DIN conducted on a data input bus 83 is illustratively input to both a mask latch 84 and a data latch 88. Bus 83 is preferably, but not limited to, a 4-bit width. Mask latch 84 preferably receives the row enable signal /RE as an input latch enable. Data latch 88 preferably receives the write enable signal /WE as an input latch enable. The outputs of both latches 84 and 88 are preferably coupled to a data mask 92 along with write enable signal /WE and column address latch signal /CAL. As shown in FIG. 3, data mask 92 is also coupled to receive the output of decoder 82 via a bus 81. Bus 81 is preferably 4-bits wide. Column bits A9 and A10 are used by decoder 82. The output of data mask 92 is coupled via a bus 94 to a data select circuit 96. Bus 94 is also preferably 4-bits wide. Data select circuit 96 is preferably coupled through a bus 97, preferably 4-bits wide, to multiplexer 48.

Figure 4:
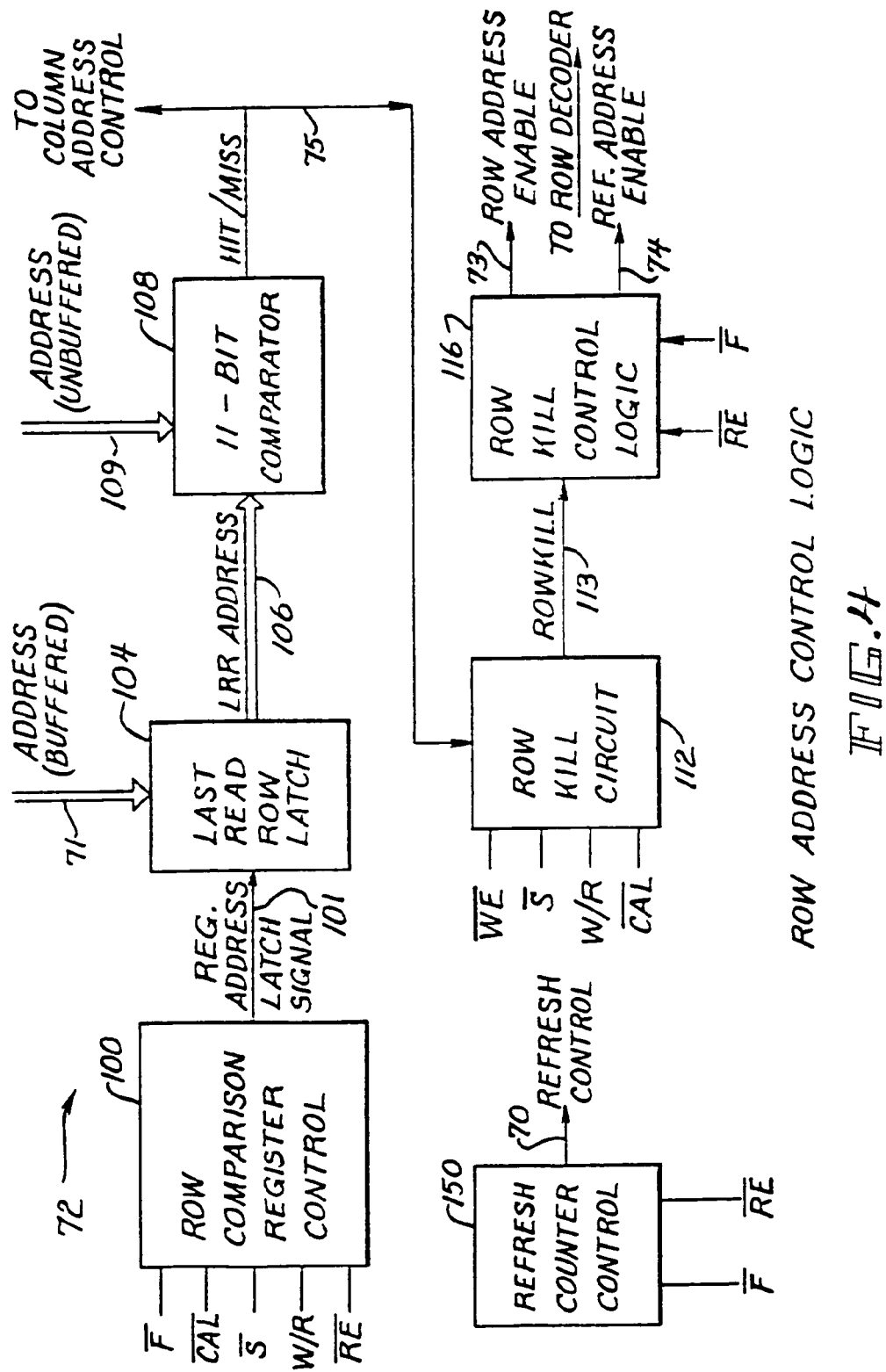
FIG. 4 is a detailed block diagram of row address control logic circuitry of FIG. 3.

FIG. 4 shows further details of the row address control logic circuit block 72 of FIG. 3. In FIG. 4, a row comparison register control circuit 100 is preferably coupled to receive as inputs the refresh control signal /F, column address latch signal /CAL, chip select signal IS, write/read signal W/R and row enable signal /RE. The output of latch control 100 is illustratively connected via a line 101 to one or more last read row latches 104. Each latch 104 also preferably receives row address data from bus 71. Therefore, each DRAM subarray 40 of the EDRAM will have a respective last read row latch 104 to store address information identifying the last read row from its corresponding memory block. The output of latch 104 is preferably provided via a bus 106 to a comparator 108. Comparator 108 preferably compares two 11-bit address inputs, one of which is provided by latch 104. The other 11-bit address input is received preferably through a bus 109. Comparator 108 generates a hit/miss signal which is transmitted via line 75 to a row kill circuit 112 and column address control logic circuit 76 (FIG. 3).

Row kill circuit 112 preferably receives as inputs write enable signal /WE, chip select signal /S, write/read signal W/R and column address latch signal /CAL. It checks the inputs to determine whether a write cycle or a read miss cycle is required. If no such cycle is required, it provides a row kill signal to a row kill control logic circuit 116 by way of a line 113.

In addition to receiving the row kill signal, control logic 116 preferably is coupled to receive row enable signal /RE and refresh control signal /F. Control logic circuit 116 determines from these inputs whether it should enable the row decoder 52 (FIG. 3) to latch either the refresh address from refresh counter 68 or the row address from address bus 71. Generally, row enable signal /RE when active signifies a request from the user (e.g., CPU 30) for access to the DRAM array 40 (read or write). When refresh control signal /F is active, it signifies that array 40 is to be refreshed, so row decoder 52 must latch row refresh address data. However, if the row kill signal is active, then the two outputs from control logic 116 will be inactive, which keeps the row decoder 52 from latching any address. Since no row address is latched or decoded, the memory array 40 is not accessed and there is no destructive read, and no need to initiate precharge or refresh. The outputs "row address enable" and "refresh address enable" of control logic 116 are coupled via lines 73 and 74, respectively, to row decoder 52.

FIG. 5 shows further details of the column address control logic circuit block 76 of FIG. 3. FIG. 5 preferably includes a column kill detector circuit 120 which preferably receives the following input signals: row enable /RE, write/read signal W/R, column address latch signal /CAL and write enable /WE. Detector 120 is preferably coupled to provide its output signal, called ColKill, via a line 121 to a column address control circuit 124. Detector 120 operates in a manner similar to row kill circuit 112 (FIG. 4). It detects whether a valid read or write cycle has been initiated.

Control circuit 124 also preferably receives the following input signals: "hit/miss", write/read W/R, row enable /RE and column kill ColKill. From these inputs, control 124 determines whether a column read or column write is to occur. It generates four outputs, of which ROK ("read OK"), /LOAD, and WOK ("write OK") are coupled to a column read/write controller 130 by way of lines 126, 127 and 128 as shown in FIG. 5. Preferably line 127 is also connected to a load multiplexer controller 134. A fourth output COLAE (column address enable) of controller 124 is output over line 78 to column decoder 60 (FIG. 3).

Column read/write controller 130 also receives as further inputs write enable /WE and /CAL. Controller 130 also preferably outputs /Yre and /Ywe through lines 79 and 77, respectively, to column decoder 60.

Load multiplexer controller 134 preferably receives as inputs address bit $A_{10}$ and /RE. The outputs of controller 134, load1 and load2, are illustratively coupled to multiplexer 48 via lines so.

FIG. 6 shows circuit details of part of a row register and its associated write and load circuit 48. It will be understood that a DRAM subarray contains numerous memory cells arranged in rows and columns, and it would be typical for there to be 1,064 columns in each subarray. For reasons that will become apparent, the preferred embodiment uses one-half as many FIG. 6 circuits as there are columns. In FIG. 6, field effect transistors are shown for illustrative purposes. Other types of transistors or switching devices may be employed. In FIG. 6, a first pair of complementary bit lines BIT0 and /BIT0, and a second such pair BIT1 and /BIT1 are the bit lines from memory subarray 40 (not shown) of FIG. 3. In FIG. 3 they are part of lines 45 but in FIG. 6 they are labeled as lines 45-1, 45-2, 45-3, and 45-4. These bit lines are coupled to an input (write) port formed by write transistors 203, 205, 207, and 209 which, when activated by a decoded line, allow input data DIN to pass through the write transistors onto the bit lines. Hence the drains of these four write transistors are coupled to bus 97 (FIG. 3) which provides the selected input data. Bus 97 is illustratively composed of DIN0, /DIN0, DIN1, AND /DIN1. The gate electrodes of the write transistors 203, 205, 207, and 209 of the input port are coupled to a selected (decoded) line from Yw bus 62.

The bit lines 45-1,2,3,4 are selectively coupled by field effect transistors 212, 214, 216, and 218 or other switching devices to lines 222, 224, 226, and 228, respectively. Lines 222-228 are connected to the static RAM latches formed by, e.g., inverter circuits 142, 144 of the row register 56. Transistors 212-218 allow the DRAM bit lines 45-1,2,3,4 to be selectively decoupled from lines 222-228 and from the latch. Thus, bit lines from DRAM subarray 40 are preferably coupled to the sources of transistors 212-218. Preferably, the gate electrodes of transistors 212 and 214 are coupled together to receive the signal Load 1. Similarly, the gate electrodes of transistors 216, 218 together receive the Load 2 signal.

The Load 1 and Load 2 signals are provided from column address control logic circuit 76 (FIG. 3) and more particularly from the load multiplex controller 134 thereof (FIG. 5). Lines 222 and 228 are coupled to the input of inverter 142, the output of inverter 144, to each other, and to the gate electrode of one of a group of four output transistors 230, 232, 234, and 236 which form a dedicated data output (read) port. In particular, line 222 is coupled to the gate electrode of transistor 232 (and hence sees a high impedance). Lines 224 and 226 are coupled to the output of inverter 142, the input of inverter 144, to each other, and to the gate electrode of output transistor 236.

The sources of transistors 232 and 236 are coupled to ground potential (Vss). Their drain electrodes are coupled to the sources of transistors 230 and 234 respectively. The gate electrodes of transistors 230 and 234 are both connected to a decoded line 61, which preferably conducts the appropriate column read signal Yr. The drains of 230 and 234 are respectively coupled to bus 57 to carry signals $d_{out}$ and $/d_{out}$.

FIG. 7 shows where several of the circuits described herein can be arranged on an integrated circuit. FIG. 7 shows a plurality of DRAM subarrays 40. Illustratively each such subarray is 128 by 2 k. Adjacent each such subarray 40 is a plurality of corresponding sense amplifiers ("S.A.") 44. Preferably there are 1 k of such sense amplifiers adjacent to the corresponding DRAM subarray. Also adjacent to the DRAM subarray is a set of preferably 512 row registers. Located beside the set of row registers is preferably 1 of 256 column decoders (unnumbered). These column decoders are part of circuit block 60 of FIG. 3.

Located beneath the DRAM subarray (in plan view) is 1 of 128 row decoders. Row decoders are part of circuit block 52 in FIG. 3. Adjacent the row decoder is register control and address control circuitry, which corresponds to all of the FIG. 3 circuit blocks 72 and 76, and part of circuit blocks 52 and 60.

It will be seen that an EDRAM according to the preferred embodiment of the present invention integrates a plurality of static RAM type of cells (latches) connected via pass gates to the DRAM bit lines to be used for various functions, including functioning as a cache to accelerate access time. It is also useful to expand page mode read cycles over precharge periods and refresh periods.

In a standard DRAM, while /RAS is low, the device can cycle through the column addresses and perform reads and writes at a much faster rate and cycle time than it would be able to do by cycling /RAS. That enhancement is referred to in the art as "page mode" or "static column mode." Functionally speaking, the present invention in its preferred form provides a device which, from the outside, looks much like a standard DRAM. However, it allows the maximum flexibility for usage of its row registers to hide precharges, hide refreshes, and accelerate accesses. To do that, a set of external pins is preferably assigned in a way (as set forth above) that looks somewhat similar to the functionality of external pins on a standard DRAM. The external pins used for control functions receive the following signals: the /RE signal, which is comparable to /RAS on a standard DRAM; /CAL, which is comparable to /CAS in a standard DRAM; and /WE which is comparable to /WE on a standard DRAM. However, further control pins are used to receive the control functions /F, /S, and W/R which were described above.

An advantage of changing from a /CAS function to a /CAL function is that the device uses it preferably only as a column address latch signal. It no longer has any function in output control nor as an internal refresh signal. Responsibility for those functions is assigned to other signals at other pins. For example, the /F signal is to replace one function of the standard /CAS pin as a "/CAS before /RAS" refresh indicator.

The output control is implemented through the /G signal which is shown at the top of FIG. 3 going into block 64. In the preferred embodiment, that is the only output control signal. So the /G, /F and /CAL pins with their respective signals collectively provide the functions that a /CAS pin /CAS signal would have on a standard part.

Similarly, a standard part has a /RAS pin for receiving the row address strobe. This function is replaced by the /RE signal at the /RE pin. The /RE signal preferably does not have the disable function that the standard /RAS signal would have had. On a standard part, when /RAS goes high, any page mode access must be terminated. On the preferred EDRAM, the row registers allow a user to continue a cage mode access through precharge periods which are indicated by /RAS high, and during /F refreshes, which are comparable to a standard /CAS before /RAS refresh. Therefore, /RE does not have a power down or a complete part disable function that a standard /RAS pin would have. It is still used as a row address latch and as a DRAM cycle initiator. The /S pin provides the power down function that a standard /RAS pin would have provided (as one of its several functions).

Operation of the Circuit

Refresh

Standard DRAM arrays have to be refreshed on a somewhat regular basis because of the leakage from the DRAM cells. On a standard device means are provided to be able to do that without providing external addresses. A standard device commences its refresh cycle in response to the combination of input signals where /CAS is low when /RE falls. At that time, internal chip logic recognizes that combination of voltages at the corresponding pins and generates an address internally that is independent of what is provided on the address pins that are external to the chip. The internal chip logic then activates the DRAM by driving a DRAM row signal to an active state. That allows the data stored in one entire row of DRAM cells to be transferred onto the bit lines. Once that has taken place, the sense amplifiers are activated to amplify that signal. In the course of amplifying that signal, it refreshes the state of the DRAM cell, i.e., it drives the bit lines that are connected by the active row to full logic states to be stored in the DRAM cells. In the process of doing that, it writes that state back into the selected row of DRAM cells. That is all that is necessary in order to execute a refresh for that row. Once that has been completed, the row can be driven inactive again. The sense amplifiers then will be precharged to their standby state, another row will be selected and refreshed, and so forth until the refresh cycle is completed.

The EDRAM according to the preferred embodiment also provides internal circuitry to achieve refreshing, but it operates without using a /CAS before /RAS sequence to signal such a function. The /F signal, which preferably is received at its own respective pin, is an externally applied control signal indicating that a refresh is necessary. One advantage of this combination of signals is that page mode access (which requires the use of /CAL) can be executed during the refresh. Hence the pin that receives the /CAL signal, which preferably is a dedicated pin, is free to be able to do that, even while the DRAM refresh is taking place. Hence, the /F pin is provided to decouple that function from the /CAS pin. Other than that, the refresh circuitry is fairly standard DRAM circuitry and operates in like manner.

Row Register Access During Refresh

One key aspect in the operation of a device according to the present invention is that because there is data stored in the row registers, the row registers can be decoupled from the corresponding DRAM subarray. Therefore, while that refresh is taking place, those row registers can continue to provide output data to the output data buffers 64 in FIG. 3.

Essentially, the /RE signal is used to request access of any type to the DRAM subarrays. If /RE is not toggled, access is available to the row registers only. There are three main varieties of access to the DRAM subarrays: (1) a refresh, (2) a read cycle, and (3) a write cycle. In each of these cases, the type of cycle requested is indicated to the EDRAM prior to the falling edge of /RE, which is the actual request for access to DRAM cells.

If /F is low prior to /RE falling, that indicates that the requested access is a refresh access. During a refresh access, the row decoder address will be supplied from the refresh address counter 68. The DRAM will be activated, the sense amplifiers 44 will be triggered, but the write and load multiplexer 48 will not be activated, so that the row registers are disconnected from the DRAM subarray and can be accessed from the outside of the chip in a read fashion. That is one of the major advantages of this invention. By toggling /CAL during this refresh, or merely by providing column addresses during this period of time, reading in a fashion that looks very much like a page mode read in a standard DRAM can continue to be executed throughout the period of time that the refresh is taking place. The refresh is a fairly long cycle because it requires access to the DRAM subarrays. In one embodiment, 35 nanoseconds may be specified to access the subarray and another 25 nanoseconds to precharge it before another access is available. The access to the row registers may take only 15 nanoseconds, e.g., and so there is a 60 nanosecond dead time that a prior art part would suffer while performing that refresh. During this refresh and precharge time, a standard part would not provide access to any of the data because a standard part would need to read data from its sense amplifiers. However, during a refresh, the sense amplifiers are busy doing the refresh and are therefore not available to provide data to the outputs. In an EDRAM according to the present invention, however, data is taken from the row register 56 rather than from the sense amplifiers 44. Consequently, the data in the row registers can be made continually available while the sense amplifiers are active doing the refresh.

Read Cycles

Two other types of /RE cycles are read and write type of /RE cycles. Henceforth, we will refer to a "user" to mean a CPU 30, a host system, or any other system that uses an EDRAM 34. When a user wants to execute a read type of access to the DRAM array, this in essence means that the data in the row registers is thought by the user not to be the data desired to be read. If the desired data is already in the row registers, the user does not need to toggle /RE in order to read it. Driving /RE to the active state means that the user thinks it needs access to the DRAM array rather than only the row registers. If it thinks that the data it wants is already in the row registers, it can leave /RE sitting high (inactive) and continue to access the row registers in a page mode type of cycle. The EDRAM user may simply provide a column address, and stored data will come out (assuming /G is toggled low to activate output circuits).

Now, if the user has decided that the data it wants is not in the row registers, it is going to request access to the DRAM in a read cycle. A read cycle as opposed to a write cycle, is indicated by the state of W/R being low when /RE falls. This means that the user wants to take data out of the DRAM. Since the EDRAM permits read only via row registers, this means that data is to be read from the addressed DRAM cell and loaded into the row registers. The device responds as follows. Initially it confirms that the requested data is not already in the row registers. Internally, comparator 108 (FIG. 4) looks at the row address provided by the user and determines whether the data is already in the row registers. The last read row latch 104 for the subarray corresponding to the address given by the user is where the EDRAM will have stored the address of the previously loaded data. Comparator 108 will compare the "last read row" (LRR) address with the address on the input pads to determine whether or not the data which the user requests to be loaded is, in fact, already loaded. If the requested data is found to have been already loaded, then the device will abort the requested access to the DRAM subarray and simply output the data that it had already loaded in the row register. This can be done very quickly, e.g. in 15 nanoseconds, because this is essentially a page mode type of access to the row register access, and no access to the DRAM is necessary.

The benefit of operating in this way is that even though EDRAM 34 knows that the user thinks the data it wants is not in the row register, EDRAM 34 checks to find out. If the data is there, then the EDRAM shortens the cycle. One may think this would be disadvantageous because the user should already know that it does not need to toggle /RE. However, it takes the user a certain amount of time to do such a comparison externally. So, the EDRAM preferably will allow the user to assume that the desired data is not in the row registers and will accelerate the read out if it is there. That way, the user does not have to make that determination before it toggles /RE. This results in faster system operation.

Hence, in a read hit, if a /RE active read cycle is executed to a row address that matches the last row read address (LRR), the /RE cycle is internally terminated, independent of the external state of the /RE signal, and data becomes valid at the DQ pins after a column address access time or a "column address latch high to data valid time," whichever is greater.

Read Miss

Another type of cycle on an active /RE signal is a genuine read miss. On a read miss, the comparator on FIG. 4 determines that in fact the user is correct and the data that it wants is not already loaded into the row register 56. On that type of cycle, the DRAM portion of the EDRAM will be activated. The row decoder and address latch 52 on FIG. 3 will operate to drive a DRAM word line high. The data from the (decoded) row of DRAM cells will be loaded onto the bit lines 45, and the corresponding sense amplifiers 44 will be triggered in the same fashion as they were on the refresh cycle discussed above.

Once sense amplifiers 44 have substantially latched and driven the bit lines 45 to the state indicated by the data in the addressed DRAM cells, a selected one of the two load lines 80 in FIG. 3 will be activated. The activation of a load line will cause the data that has been latched by the sense amplifiers to be transferred into the row registers, thereby overwriting the prior data which had been latched there. Similarly, the hit/miss determination (on line 75) will signal the last read row latch 104 (corresponding to the DRAM subarray) in FIG. 4 to latch the address that is currently on the pads so that future comparisons for that subarray will compare to the address for which the data has now been loaded into the row registers. This cycle takes illustratively 35 nanoseconds because it is an access to the DRAM array. After that 35 nanosecond time, data is made available to the output data buffers 64 from the row registers 56. Once that has been done, additional column addresses can be supplied at a 15 nanosecond cycle rate in much the same fashion as the standard page mode.

Precharge During Read

During a read, the externally-applied /RE signal can go high, and the DRAM subarray can be precharged without terminating that page mode. When /RE goes high, first all load selection lines 80 are turned off, thereby decoupling the row registers 56 from the DRAM subarrays 40. This allows the row registers to continue supplying data to the output data buffers 64 while the DRAM subarray is being deactivated. The row decoder is then deactivated so that the word lines are driven inactive and the data is therefore kept in DRAM cells. The sense amplifiers are then precharged and the DRAM subarray is put into a standby state.

Write Cycles

The third type of /RE cycle is a write cycle. For write cycles, the W/R pin is driven high prior to the falling edge of the /RE signal on the /RE pin. The write enable signal /WE on the /WE pin is also activated. An active signal at the /RE pin indicates that the user has requested access to the DRAM subarray, and a high signal at the W/R pin indicates that the user wishes to write. When this combination of input control signals exists, a write is signalled, and the EDRAM 34 knows that access to the DRAM truly needs to occur. So, the EDRAM immediately activates row decoder 52 to decode the address provided on the external pins. The row address control logic 72 will enable the row address enable signal on line 73 rather than the refresh address enable signal on line 74. That will allow the row decoders to latch the addresses A0-A10 provided on bus 71 rather than the addresses provided by the refresh counter 68 on bus 69. (Column addresses are provided on the same bus 71 into column decoder 60, but at a different time. Row addresses are considered valid only at the falling edge of /RE and slightly prior to it. Anything else is considered a column address.) The active /RE signal indicates that in fact a row address is on bus 71. The row decoders 52 now become active again, and a selected row of the DRAM is sensed by the sense amplifiers 44. Whether this is a write hit or a write miss does not matter for this much of the cycle because the part knew that since a write is ordered, it must in fact access the DRAM subarray.

If the designated address is a write hit, once the sense amplifiers are latched, EDRAM 34 will activate either the Load 1 or Load 2 signal. Whether it is Load 1 or Load 2 will be determined by the A10 row address going into column address control logic 76 (see FIG. 3 and FIG. 5). In a write hit, the purpose of activating a load signal is so that the data written into the DRAM subarray will also be written into the row registers 56. Write and load multiplexer 48 in FIG. 3, becomes active and couples the bit line signal, via source-drain paths of transistors, to the latches of the row registers for the addressed subarray. This preserves data coherency between the DRAM and the row registers.

If it is a write miss, the DRAM subarray but not the row registers will be written into. The row registers will continue to be decoupled from the DRAM cells by the inactivation by the write and load multiplexer 48.

Write-Per-Bit Function. In one implementation of an EDRAM, selective modification of individual I/O bits is possible. This is a "write-per-bit" feature which is useful in video applications and when the memory is used for parity bits. Mask bits and data bits are multiplexed on the I/O pins via /RE and /WE. The "mask" capture occurs on the assertion of /RE, and data capture occurs on the assertion of /WE. During the writing, the data is supplied by the user from the data-in bus 83 in FIG. 3.

More particularly, data is provided at two different times. On the falling edge of /RE, the data pins are monitored to determine what we call "mask data." Mask data is latched in the mask latch 84. Then, on the falling edge of /WE, the data to be written to the part is latched into data latch 88. That is why /WE is shown as an input to the data latch and /RE is shown as an input to the mask latch. When there is a common low of the /WE pin and the /CAL pin, the actual write will be executed to the part (subject to an exception discussed below). Once the /WE and /CAL pins are both low, the data mask circuit 92 takes the data from the data latch 88, and takes the mask data from the mask latch 84. Any of the four bits latched can be masked (not written) according the data in the mask latch.

The purpose of masking data is as follows. Suppose that the system is configured to have a four bit input, but the user really only want to write one of those four bits. Many standard parts cannot accommodate this because there is no way for the chip to refuse data being inputted. To have such a facility, the user needs a way to tell the EDRAM that although data will be provided on all four inputs, the EDRAM is to ignore the data on three of them. That is achieved by the mask latch 84 on this part. On the falling edge of /RE (mask latch data), any data bits that are high will be masked, i.e., not written by the part. Any bits that are low on the falling edge of /RE will be not ignored by the part and will be considered valid write data (when /WE becomes active).

Although a decoder 82 is shown in FIG. 3, the three circuits 82, 84, and 88 are not used simultaneously. There is no need for the "1 of 4" decoder 82 in a 4-bit part. If the part is to be a by-4 with the write per bit capability, i.e., the ability to mask input data, then mask latch 84 will be active, data latch 88 will be active, but decoder 82 going into the data mask 92 will be inactive. If the part is a by-4 without write per bit, mask latch 84 will be inactive and bits will never be masked. However, if the part is a by 1, then mask latch 84 is inactive, data latch 88 is active, but all four data latches get the same bit from data-in bus 83 and the 1 of 4 decoder 82 determines which of those four bits is useful and which are not. The other three will all be masked. The part can be made to look like a by-1, when internally it is a by-4, by simply masking three of the input bits, based on the state of the A9 and A10 column addresses (which are inputs to decoder 82). The four bits from data mask 92 are then provided to data select circuit 96, the purpose of which is to determine which of the possible bits are to be written by the four bits provided by data mask 92.

FIG. 6 is shown for a single data-out bit and two data-in bits. A given subarray has an output bus width of two bits and an input bus width of four bits. In large scale integration, of course, FIG. 6 is repeated many times, yet each of the many subarrays preferably will have only two data-out bits and four data-in bits. If there are 1,064 columns in one subarray, there are preferably 512 FIG. 6 circuits connected to that one subarray. Each subarray preferably activates two FIG. 6 circuits at once. There are 512 row register bits that go into 256 pairs of FIG. 6 circuits, and one pair of those will be selected by the column decoder. Therefore, two $d_{out}$ bits will be active at once (for outputting) or two pairs of the data-in bits (for writing).

In the preferred embodiment, two DRAM subarrays will always be accessed at the same time so that the four bits coming out of data mask circuit 92 of FIG. 3 will actually be fed to different subarrays of the chip. So the four bits on bus 94 will actually go to two different data select blocks 96. Preferably a given data select block 96 actually receives only two bits, and that is why bus 94 in FIG. 3 is marked for 2 bits. The data select block 96 has a four bit output bus 97, shown on FIG. 6 as DIN0 and DIN1. Signals DIN2 and DIN3 would be inputted on a FIG. 6 circuit directly adjacent to this one. The FIG. 6 circuits are activated in pairs. The data select circuit 96 uses the A10 (row) signal to select whether to activate DIN0 or DIN1 for a given FIG. 6. Only one of the two will ever be active at any given time; the other will always be masked.

On a 4 megabit part, there will be multiple iterations of many circuits shown in FIG. 3. For example, these may be 16 DRAM subarrays 40 16 multiplexers 48, and 16 row registers 56. Sense amplifiers 44 can be shared, so there will be multiple groups of blocks 44 but not necessarily 16 of them (e.g., 9). Column decoder and address latch 60 occurs 8 times, and each column decoder is shared between two row registers 56. The row decoder and address latch 52 occurs 16 times. The refresh address counter 68 may occur 1 or more times on the chip, and bus refresh address 69 provides all row decoders 52 with the same refresh address from the same counter. The row address control logic 72 preferably occurs 4 times on the chip, each being shared between 4 row decoder address latch blocks 52. The column address control logic 76 occurs 4 times in the same fashion. Data mask 92, data latch 88, and mask latch 84 occur 4 times on the chip, each shared between 8 DRAM subarrays. Data select circuits 96 occur 16 times, one per multiplexer 48. Decoder 82 for A9 and A10 column occurs only once on the chip.

To read out a whole row of data that had been loaded into the latches of row registers 56, assume that the load has taken place, has been terminated, and that /RE is high. Perhaps the part has been on standby for a long time, but the data that the user wants is already in the row register. In that case, if the part was deactivated by virtue of the /S pin being high, we would drop the /S pin to activate the part and take it out of a low power standby condition, provide a column address on the address bus 71, activate /G by driving it low (which activates the output circuitry), and wait for 15 nanoseconds for four bits of data to be outputted. To read the next four bits, the user can simply change the column address on the address bus 71 and wait another 15 nanoseconds. That next data would come out. That effect is very similar to a static column mode on a standard part except that the user never had to activate /RAS and therefore never had to suffer a /RAS access time before that mode could be initiated.

To operate more like a page mode on a standard part, rather than an a static column mode on a standard part, a user can choose to toggle /CAL to latch the column addresses, rather than just holding the column addresses on the bus. If /CAL is being toggled, then as soon as /CAL drops, the user can change the address on the bus without that having any effect on the part. When /CAL is high, the new column address would be supplied. Then a user can continue to execute these 15 nanosecond cycles until it has cycled through all or as many of the row register bits (which constitute one-half of the DRAM row) as desired to access.

However, at no time was the user required to drop /RE, which is comparable to a /RAS request to the DRAM.

Having read an entire row out of the row register, if the user now wants to read the next row, the part will have to load data from that next DRAM row into the row registers. Once that has been executed, reading out the data from the row register is exactly as described earlier. The loading cycle consists of supplying a row address on the address bus 71, driving the W/R pin low to indicate a read cycle from the DRAM array, and toggling the /RE pin low to initiate that cycle. From the falling edge of /RE, the DRAM subarray will be activated, and the data will be transferred into the row registers. That takes 35 nanoseconds. At the end of 35 nanoseconds, the data is in the row registers and can be read at a standard 15 nanosecond page mode access time in the same fashion described earlier. Now at this point, /RE is still low because the user activated /RE in order to initiate the load cycle of the DRAM data into the row registers. On a standard part, as soon as /RAS goes high, access to the data would be terminated and the part would be in what is commonly referred to as the precharge portion of the cycle, which is dead time as far as the user is concerned. On this EDRAM, however, a user could terminate the /RE cycle after 35 nanoseconds and continue executing page mode reads from the row register. That would put the part in a mode identical to the mode discussed earlier where the data was already in the row register because now it is in fact already in row register. Unlike a standard part, once that precharge period has been completed, if the user wanted to execute an internal refresh of the DRAM array, it could bring /F low, toggle /RE, execute the refresh, and still continue to execute page mode reads from the row register in exactly the fashion discussed earlier.

Row Addresses vs. Column Addresses

When an address is put on bus 71 and /RE is high, the EDRAM does not know whether it is column address or a row address. It treats that address as a column address and proceeds with the column access and in parallel with preparing to use it as a row address should it become necessary. If /RE never falls, the address will continue to be treated as a column address until eventually that access is completed. However, if /RE falls, the use of the address in the column decoder is terminated (in exchange for the use of it in the row decoder). At that point the chip knows the user provided a row address, and needs to use that address in the row decoder and proceed with a DRAM access.

A DRAM access can be aborted in two ways. One is an illegal cycle. For example, if /CAL was low when /RE fell, that is illegal if /F was high. If an illegal cycle occurs, then the part effectively knows the user wanted to treat this as a row address, but then the user requested an illegal row cycle, and therefore the part will just ignore this address altogether. The other aborted access occurs in a read hit. On a read hit, access to the DRAM array is unnecessary, and is to be aborted because immediate access is given to the row register. Therefore, on the falling edge of /RE, the row address is latched but is not used for anything because the DRAM array is left inactive. The address bus is routed into the column decoder, and any address on the bus after /RE has fallen is treated as a column address. So if the row address is still there, it will be treated as a column address and access to that particular row register will be granted.

The preferred EDRAM device uses what may be called a "look-ahead" method and a positive row address set-up time. In a typical system, the system-wide address bus must be decoded in order to determine which of several DRAMs or which particular memory device the user will speak to. The rest of the system address bus has been routed directly to that memory device. That system level decoding typically takes on the order of 5 to 10 nanoseconds to determine which chip in the system needs to be activated and to generate the corresponding /RE strobe. Therefore a positive address time occurs automatically in most systems even though most chips do not require it. By using that period of time to determine in advance whether or not this will be a hit or a miss if a row strobe occurs, and to determine whether the address should be treated as a row address, the preferred EDRAM takes care of some overhead prior to /RE falling and therefore minimizes the amount of time required after /RE falls. It does so in a fashion that costs the system designer very little: he probably had those addresses there in advance because of the nature of his system design. So, when an address in on the bus, the part does not know whether it is a row address or a column address until /RE falls. In preparation for it possibly being a row address, the part proceeds to execute the necessary comparison by comparator 108 on FIG. 4 and determines whether or not the address is a cache hit or miss. The part also will look at the control signals and determine whether a read cycle, a write cycle, or a refresh cycle is designated so that if /RE does fall, all of those overhead control functions have already been executed and the part can proceed immediately with the DRAM cycle without any additional delays.

If /RE does not fall, comparator 108 will have been prepared for it, but the output of comparator 108 will simply be ignored with no harm done. In the meantime, that address will have been routed to the column decoder and treated as column address. The address bus 71 going into both row address decoder 52 and column address decoder 60 allows the part to prepare for the use of any given address as both a column decoder address and a row decoder address at the same time, and if /RE falls, the part aborts the column route. If /RE does not fall, the row route never happens. The address is also routed simultaneously into the row address control logic, which is where that comparison takes place.

"Write Posting"

We mentioned that when /WE and /CAL were simultaneously low, that is when the write would occur. An exception to that is if the write occurs very soon after /RE falls. When /RE falls in a write cycle, the part must always access the DRAM subarray. So when /RE falls, the part activates the row decoder, senses the DRAM data with the sense amplifiers, waits for the sense amplifiers to get substantially latched, and then does or does not activate the Load 1 or Load 2 signals, depending on whether or not it was a write hit or a write miss. All of this must occur before we can actually write anything. All of that takes 35 nanoseconds. System efficiency (i.e., the efficiency of a system such as in FIG. 2) would be enhanced if the user could (a) alert the memory 34 that this is a write cycle, (b) supply the data to write, (c) supply the column address to write to, and (d) go on about its business without continuing to hold that information for the memory. The preferred embodiment EDRAM 34 allows this to occur via write posting.

After /RE falls, if the user puts the column address on the bus immediately and then drops /CAL and /WE, EDRAM 34 will latch the input data in data latch 88 and will latch the column address in the column address latch (within circuit 60). It will then hold that information until it has completely accessed the DRAM array, fired the sense amplifiers, and turned on any necessary load signals. At that time, with the user long since gone to other activities, the memory can take that data that it latched and execute the function using an internally timed write pulse. The user does not need to provide that timing. This is unlike the standard art where the timing of that write pulse would have to be provided by the user. Therefore, on a standard part, the user cannot simultaneously drop the column address strobe /CAS and the write enable signal /WE until long after the read address strobe /RAS falls.

Another form of write posting is that on any write cycle, the memory can latch data on the falling edge of /WE, independent of the state of /CAL. It can latch column addresses on the falling edge of /CAL, independent of the state of /WE. Therefore, data and addresses do not necessarily have to be on a user external bus at the same time. That provides fewer constraints on system timing than the standard art, which requires that both data and addresses must be available at a single falling edge of either /CAL or /WE, whichever is the later of the two.

CONCLUSION

The EDRAM of the present invention produces tremendous speed with innovative architecture yielding the optimal cost-performance solution for applications such as high performance local or system main memory. In most high speed applications, no wait state performance can be achieved without secondary SRAM cache and without interleaving main memory banks at certain system clock speeds, e.g. through 40 MHz. Two-way interleave will allow no wait state operation at higher clock speeds, e.g. 50 MHz, without the need for a secondary SRAM cache. An EDRAM outperforms the combination of conventional SRAM cache plus DRAM memory systems by minimizing processor wait states for all possible bus events, not just cache hits. The combination of input data and address latching, 2K (illustratively) of fast on-chip SRAM type registers, and simplified on-chip register (cache) control allows system level flexibility, performance, and overall memory cost reduction not available with any other high density memory component on the market.

The architecture of the preferred embodiment EDRAM is similar to that of a standard 4 Mb DRAM with the addition of 2 Kb of row registers (cache) and internal control which includes a last read row address latch and an 11-bit comparator. The cache is integrated into the DRAM as tightly coupled row registers. Memory reads always occur from the cache. When the comparator detects a hit, only the cache registers are accessed and the data therefrom is available in, e.g., 15 ns access/cycle time. When a read miss is detected, the entire cache (row) is updated and data is available at the output all within a single access time of , e.g. 35 ns. Here also, subsequent reads within the new row will continue at 15 ns access/cycle time. In both cases, since the reads occur from the row registers, the DRAM precharge can occur simultaneously without degrading performance. Having an on-chip refresh counter and an independent refresh bus also allows the EDRAM of the present invention to be refreshed during row register (cache) reads.

Memory writes are always directed to the DRAM array. When appropriate, the on-chip address comparator will also activate a parallel write path to the row registers. In this way, data coherency between row registers and DRAM array data is always ensured, with no system level overhead. Due to the quick 5 ns pulse and 5 ns precharge of the EDRAM, page mode memory writes can be accomplished within a single column address cycle time. Changing rows during memory writes does not affect the contents of the cache except as appropriate for a cache write-through. This allows the system to return immediately to the cache which had been accessed just prior to the write operation.

By integrating the cache as row registers and keeping on chip control simple, the EDRAM is able to provide enhanced performance without any significant increase in die size over standard slow 4 Mb DRAMs. By eliminating the need for SRAMs and cache controllers, system cost, board space, and power are all reduced.

Further details of the structure and operation of an embodiment of the present invention are contained in the accompanying Attachment A.

It will be appreciated that the foregoing description is directed to a preferred embodiment of the present invention, and that numerous modifications or alterations can be made without departing from the spirit or scope of the present invention.

What is claimed as the invention is:

1. An integrated circuit comprising:
a row enable input for receiving a signal indicating that a row address is present at address inputs to the integrated circuit;
a row address latch for storing a row address present at address inputs to the integrated circuit;
an array of DRAM memory cells organized in rows and columns;
a set of sense amplifiers for performing a DRAM row access by accessing the array of DRAM memory cells identified by the stored row address;
a set of static registers separate from said set of sense amplifiers, wherein subsets of the static registers are associated with individual rows in said array;
a column address input for receiving a signal, during a DRAM row access, indicating that a column address is present at address inputs to the integrated circuit;
a column address latch for storing the column address during a DRAM row access in response to the column address input;
a write enable input for receiving a signal, during a DRAM row access, indicating that data is present at data inputs to the integrated circuit;
a data latch for storing data in response to the write enable input; and
a write signal generator for generating an internal write signal, after completion of the DRAM row access, to store the data in the data latch to the array of DRAM memory cells in a location identified by the column address in the column address latch.

2. The integrated circuit of claim 1 wherein each said subset set of static registers is arranged as a row and is capable of storing at least 32 data bits from said associated subset set of sense amplifiers.

3. The integrated circuit of claim 1 wherein each said subset of static registers is arranged as a row and is capable of storing at least 512 data bits from said associated subset set of sense amplifiers.

4. The integrated circuit of claim 1 wherein said array is arranged as a plurality of DRAM subarrays each having a respective plurality of bit lines, said set of static registers is arranged as a plurality of sets of registers corresponding in number to said plurality of DRAM subarrays, each said subarray is coupled to only one respective set of said registers, and each set of registers is coupled to receive and store read data from only one corresponding DRAM subarray.

5. The integrated circuit of claim 4 wherein each of said set of static registers is arranged as a row and is capable of storing at least 32 data bits from its said corresponding DRAM subarrays.

6. The integrated circuit of claim 5 wherein each said DRAM subarray is positioned between its respective set of said registers and the said set of associated sense amplifiers corresponding to said subarray.

7. The integrated circuit of claim 4 wherein each of said set of static registers is arranged as a row and is capable of storing at least 512 data bits from its said corresponding DRAM subarray.

8. The integrated circuit of claim 7 wherein each said DRAM subarray is positioned between its respective set of said registers and the said set of associated sense amplifiers corresponding to said subarray.

9. The integrated circuit of claim 1, further comprising a multiplexer coupling circuit interposed between said set of sense amplifiers and said set of static registers, said multiplexer coupling circuit configured to selectively provide direct data transfer between said set of sense amplifiers and said set of static registers multiplexed down by a factor of at least two.

10. An integrated circuit comprising: an
output buffer;
a row enable input for receiving a signal indicating that a row address is present at address inputs to the integrated circuit;
a row address latch for storing a row address present at address inputs to the integrated circuit;
an array of DRAM memory cells organized in rows and columns;
a set of sense amplifiers for performing a DRAM row access by accessing the array of DRAM memory cells identified by the stored row address;
a set of static registers separate from said set of sense amplifiers, wherein subsets of the static registers are associated with individual rows in said array;
a column address input for receiving a signal, during a DRAM row access, indicating that a column address is present at address inputs to the integrated circuit;
a column address latch for storing the column address during a DRAM row access in response to the column address input;
a write enable input for receiving a signal, during a DRAM row access, indicating that data is present at data inputs to the integrated circuit;
a data latch for storing data in response to the write enable input;
a write signal generator for generating a write signal, after completion of the DRAM row access, to store the data in the data latch to the array of DRAM memory cells in a location identified by the column address in the column address latch;
a plurality of read only bit lines selectively coupled to said set of static registers and to the output buffer;
a plurality of write only bit lines selectively coupled to said set of sense amplifiers and configured so that all data to be written to said array is written to said sense amplifiers using said write only bit lines and not said read only bit lines,
wherein said set of sense amplifiers and said set of static registers are respectively disposed on opposing ends of said array of DRAM memory cells, and
wherein, in response to a data request including an address that identifies a row in said array that corresponds to a subset of static registers, said read only bit lines being coupled to the corresponding subset of static registers and said write only bit lines being coupled to the corresponding subset of sense amplifiers such that data in the corresponding subset of static registers is output to said output buffer using the subset of sense amplifiers associated with the row identified by the data request address.

11. The integrated circuit of claim 10 wherein each said subset set of static registers is arranged as a row and is capable of storing at least 32 data bits from said associated subset set of sense amplifiers.

12. The integrated circuit of claim 10 wherein each said subset of static registers is arranged as a row and is capable of storing at least 512 data bits from said associated subset of sense amplifiers.

13. The integrated circuit of claim 10 wherein said array is arranged as a plurality of DRAM subarrays each having a respective plurality of bit lines;
wherein said set of static registers is arranged as a plurality of sets of registers corresponding in number to said plurality of DRAM subarrays; and
wherein each said subarray is coupled to only one respective set of said registers, and each set of registers is coupled to receive and store read data from only one corresponding DRAM subarray.

14. The integrated circuit of claim 13 wherein each of said set of static registers is arranged as a row and is capable of storing at least 32 data bits from its said corresponding DRAM subarrays.

15. The integrated circuit of claim 14 wherein each said DRAM subarray is positioned between its respective set of said registers and the said set of associated sense amplifiers corresponding to said subarray.

16. The integrated circuit of claim 13 wherein each of said set of static registers is arranged as a row and is capable of storing at least 512 data bits from its said corresponding DRAM subarray.

17. The integrated circuit of claim 16 wherein each said DRAM subarray is positioned between its respective set of said registers and the said set of associated sense amplifiers corresponding to said subarray.

18. The integrated circuit of claim 10, further comprising a multiplexer coupling circuit interposed between said set of sense amplifiers and said set of static registers, said multiplexer coupling circuit configured to selectively provide direct data transfer between said set of sense amplifiers and said set of static registers multiplexed down by a factor of at least two.

19. The integrated circuit comprising:
an output buffer;
a row enable input for receiving a signal indicating that a row address is present at address inputs to the integrated circuit;
a row address latch for storing a row address present at address inputs to the integrated circuit;
an array of DRAM memory cells organized in rows and columns;
a set of sense amplifiers for performing a DRAM row access by accessing the array of DRAM memory cells identified by the stored row address;
a set of static registers separate from said set of sense amplifiers, wherein subsets of the static registers are associated with individual rows in said array;
a column address input for receiving a signal, during a DRAM row access, indicating that a column address is present at address inputs to the integrated circuit;

a column address latch for storing the column address during a DRAM row access in response to the column address input;

a write enable input for receiving a signal, during a DRAM row access, indicating that data is present at data inputs to the integrated circuit;

a data latch for storing data in response to the write enable input;

a write signal generator for generating a write signal, after completion of the DRAM row access, to store the data in the data latch to the array of DRAM memory cells in a location identified by the column address in the column address latch;

a plurality of read only bit lines selectively coupled to said set of static registers and to the output buffer, a decoupling circuit configured to decouple said array from the said registers when data is being output from said registers to said output buffer via said read only bit lines; and a precharging circuit coupled to the decoupling circuit that is configured to precharge said array in preparation for transferring data from said array and said sense amplifiers to said registers contemporaneously with the data being output from said registers to said output buffer via said read only bit lines wherein said set of sense amplifiers and said set of static registers are respectively disposed on opposing ends of said array of DRAM memory cells, and wherein, in response to a data request including an address that identifies a row in said array that corresponds to a subset of static registers, said read only bit lines being coupled to the corresponding subset of static registers such that data in the corresponding subset of static registers is output to said output buffer using the subset of sense amplifiers associated with the row identified by the data request address.

20. The integrated circuit memory chip as claimed in claim 19, further comprising a refresh circuit coupled to the decoupling circuit configured to refresh said array contemporaneously with the said data being output from said registers to said output buffer via said read only bit lines.

21. The integrated circuit as claimed in claim 19, further comprising a multiplexer coupling circuit interposed between said set of sense amplifiers and said set of static registers, said multiplexer coupling circuit configured to selectively provide direct data transfer between said set of sense amplifiers and said set of static registers multiplexed down by a factor of at least two.

22. An integrated circuit comprising:

an output buffer;

a row enable input for receiving a signal indicating that a row address is present at address inputs to the integrated circuit;

a row address latch for storing a row address present at address inputs to the integrated circuit;

an array of DRAM memory cells organized in rows and columns;

a set of sense amplifiers for performing a DRAM row access by accessing the array of DRAM memory cells identified by the stored row address;

a set of static registers separate from said set of sense amplifiers, wherein subsets of the static registers are associated with individual rows in said array;

a column address input for receiving a signal, during a DRAM row access, indicating that a column address is present at address inputs to the integrated circuit;

a column address latch for storing the column address during a DRAM row access in response to the column address input;

a write enable input for receiving a signal, during a DRAM row access, indicating that data is present at data inputs to the integrated circuit;

a data latch for storing data in response to the write enable input; and a write signal generator for generating an internal write signal, after completion of the DRAM row access, to store the data in the data latch to the array of DRAM memory cells in a location identified by the column address in the column address latch;

a plurality of read only bit lines selectively coupled to said set of static registers and to the output buffer; and an address comparator configured to, in response to a data request including an address that identifies a row in said array that corresponds to a subset of static registers, signal the corresponding subset of static registers to output data using read only bit lines coupled to the corresponding subset of static registers to said output buffer without access to said array of DRAM memory cells, the data being output to said output buffer using the subset of sense amplifiers associated with the row identified by the data request address, wherein said set of sense amplifiers and said set of static registers respectively disposed on opposing ends of said array of DRAM memory cells.

23. The integrated circuit of claim 22, further comprising a multiplexer coupling circuit interposed between said set of sense amplifiers and said set of static registers, said multiplexer coupling circuit configured to selectively provide direct data transfer between said set of sense amplifiers and said set of static registers multiplexed down by a factor of at least two.

24. A method comprising:

receiving a row enable signal and row address at an integrated circuit memory device and responsively storing the row address in a row address latch;

accessing an array of DRAM memory cells identified by the row address by triggering a set of sense amplifiers associated with the array of DRAM memory cells;

responsive to receiving a column address latch signal at the integrated circuit memory device during the accessing of the array of DRAM memory cells, storing a column address in a column address latch;

responsive to receiving a write enable signal at the integrated circuit memory device during the accessing of the array of DRAM memory cells, storing data in a data latch; and, generating a write signal within the integrated circuit memory device after accessing the array of DRAM memory cells, and responsively writing the data stored in the data latch to the array of DRAM memory cells in a location identified by the column address from the column address latch.

25. The method of claim 24, wherein the column address and the data are received simultaneously at the integrated circuit.

* * * * *